United States Patent
Ogawa et al.

(10) Patent No.: US 7,045,447 B2
(45) Date of Patent: May 16, 2006

(54) SEMICONDUCTOR DEVICE PRODUCING METHOD AND SEMICONDUCTOR DEVICE PRODUCING APPARATUS INCLUDING FORMING AN OXIDE LAYER AND CHANGING THE IMPEDANCE OR POTENTIAL TO FORM AN OXYNITRIDE

(75) Inventors: Unryu Ogawa, Tokyo (JP); Naoya Yamakado, Tokyo (JP); Tadashi Terasaki, Tokyo (JP); Shinji Yashima, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/396,323

(22) Filed: Mar. 26, 2003

(65) Prior Publication Data

US 2003/0224616 A1    Dec. 4, 2003

(30) Foreign Application Priority Data

Mar. 26, 2002 (JP) .............................. 2002-085224
Apr. 3, 2002 (JP) .............................. 2002-101103
May 21, 2002 (JP) .............................. 2002-145759

(51) Int. Cl.
*H01L 21/3205* (2006.01)
*H01L 21/4763* (2006.01)
*H01L 21/31* (2006.01)
*H01L 21/469* (2006.01)

(52) U.S. Cl. ................... 438/585; 438/771; 438/776; 438/788; 438/792

(58) Field of Classification Search ................ 438/585, 438/771, 776, 788, 792
See application file for complete search history.

(56) References Cited

U.S. PATENT DOCUMENTS 5,717,486 A * 2/1998 Burri et al. .............. 356/240.1
6,951,787 B1 * 10/2005 Allman et al. .............. 438/239
2002/0197856 A1 * 12/2002 Matsuse et al. ............. 438/652

FOREIGN PATENT DOCUMENTS

| JP | 11-121198 A | 4/1999 |
| JP | 11-279773 A | 10/1999 |
| JP | 3080867 B2 | 6/2000 |
| JP | 2001-102581 A | 4/2001 |
| JP | 2001-160555 A | 6/2001 |
| JP | 2002-045683 A | 2/2002 |
| TW | 394970 | 6/2000 |
| TW | 477010 | 2/2002 |

OTHER PUBLICATIONS http://farside. ph.utexas. edu/teaching/ em1/ lectures/node 65.html*
Y. Li et al., "Plasma-density control in a magnetron-type RF plasma," Plasma Source Sci. Technol. vol. 5, p. 241-244, 1996.
Y. Li et al., "Plasma Structure in a Modified Magnetron-Typed RF Discharge," Proceedings of the 13th Symposium on Plasma Processing, Jan. 29-31, 1996.

* cited by examiner

*Primary Examiner*—William M. Brewster
(74) *Attorney, Agent, or Firm*—Birch, Stewart, Kolasch & Birch, LLP

(57) ABSTRACT

A semiconductor device producing method using a plasma processing apparatus including a processing chamber, a substrate-supporting body which supports a substrate in the processing chamber, and a cylindrical electrode and a magnetic lines of force-forming member disposed around the processing chamber, comprises forming an oxide film on the substrate, and thereafter, by changing a high frequency impedance of the substrate-supporting body, continuously forming an oxynitride film by nitriding the oxide film by activated species of nitrogen which are activated by plasma.

21 Claims, 5 Drawing Sheets

SEMICONDUCTOR DEVICE PRODUCING METHOD AND SEMICONDUCTOR DEVICE PRODUCING APPARATUS INCLUDING FORMING AN OXIDE LAYER AND CHANGING THE IMPEDANCE OR POTENTIAL TO FORM AN OXYNITRIDE

BACKGROUND OF THE INVENTION

1. Field of the Invention

The present invention relates to a producing method of a semiconductor device and a semiconductor device producing apparatus, and more particularly, to a producing method of a semiconductor device using plasma processing and a semiconductor device producing apparatus using plasma.

2. Description of the Related Art

In producing an MOS-type semiconductor device based on a silicon semiconductor substrate for example, it is necessary to form a gate oxide film comprising a silicon oxide film on a surface of the silicon semiconductor substrate. In producing a thin film transistor (TFT) also, it is necessary to form a gate oxide film on a surface of a silicon layer provided on a transparent glass substrate. This gate oxide film bears the reliability of the semiconductor device, and the silicon oxide film is required to have high dielectric breakdown resistance and long term reliability.

In recent years, in a CMOS transistor, an effort is under way to lower the voltage in order to lower the power consumption. For this purpose, threshold voltage which is symmetric and sufficiently low with respect to a PMOS semiconductor device and an NMOS semiconductor device is required. To meet this requirement, in the PMOS semiconductor device, a gate electrode comprising a poly-silicon layer including p-type impurities is used instead of a conventional gate electrode comprising a poly-silicon layer including n-type impurities. However, generally used boron atom (B) which is p-type impurity atom passes through a gate oxide film from a gate electrode by various thermal processing procedure in semiconductor producing procedure after the gate electrode is formed, and reaches a silicon semiconductor substrate, and adversely varies the threshold voltage of the PMOS semiconductor device.

This phenomenon appears more outstandingly when the gate oxide film is made thin for making a design rule of the semiconductor device finer and for lowering electric power with reduction in power consumption.

In order to restrain the boron atom (B) which is the impurity atom from dispersing into the silicon semiconductor substrate, it is conceived that nitrogen atom should be introduced into the gate oxide film. It is possible to introduce nitrogen atom into a gate insulative film in an ammonia atmosphere at a high temperature using a thermal nitriding method. If this thermal nitriding method is used, however, the nitrogen atom passes through the gate oxide film and enters also into the silicon semiconductor substrate, and lowers the current driving ability of the semiconductor device.

Further, if the forming processing of the gate oxide film and the nitriding processing are carried out in separate processing chambers, since the gate oxide film is exposed to an atmosphere or an atmosphere in a transfer chamber having low degree of vacuum after the gate oxide film is formed, there is an adverse possibility that organic contaminant adheres to a surface of the gate oxide film to deteriorate characteristics of the device.

SUMMARY OF THE INVENTION

Thereupon, it is a main object of the present invention to provide a semiconductor device producing method and a semiconductor device producing apparatus capable of restraining leak current of an insulative film and capable of preventing organic contaminant from adhering to a surface of a substrate.

According to a first aspect of the present invention, there is provided a semiconductor device producing method using a plasma processing apparatus including a processing chamber, a substrate-supporting body which supports a substrate in the processing chamber, and a cylindrical electrode and a magnetic lines of force-forming member disposed around the processing chamber, comprising:

forming an oxide film on the substrate, and thereafter, by changing a high frequency impedance of the substrate-supporting body, continuously forming an oxynitride film by nitriding the oxide film by activated species of nitrogen which are activated by plasma.

According to a second aspect of the present invention, there is provided a semiconductor device producing method using a plasma processing apparatus including a processing chamber, a substrate-supporting body which supports a substrate in the processing chamber, and a cylindrical electrode and a magnetic lines of force-forming member disposed around the processing chamber, comprising:

forming an oxide film on the substrate, and thereafter, by changing an electric potential of the substrate-supporting body, continuously forming an oxynitride film by nitriding the oxide film by activated species of nitrogen which are activated by plasma.

According to a third aspect of the present invention, there is provided a semiconductor device producing method using a plasma processing apparatus including a processing chamber, a substrate-supporting body which supports a substrate in the processing chamber, and a cylindrical electrode and a magnetic lines of force-forming member disposed around the processing chamber, the plasma processing apparatus producing plasma in a plasma producing region in the processing chamber and subjecting the substrate to plasma processing, comprising:

forming an oxide film on the substrate, and thereafter, by changing a difference between an electric potential of the substrate-supporting body and a space electric potential of the plasma producing region, continuously forming an oxynitride film by nitriding the oxide film by activated species of nitrogen which are activated by plasma.

According to a forth aspect of the present invention, there is provided a semiconductor device producing apparatus, comprising:

a processing chamber, a substrate-supporting body which supports a substrate in the processing chamber, a cylindrical electrode and a magnetic lines of force-forming member disposed around the processing chamber, and a changing device which changes a high frequency impedance of the substrate-supporting body, wherein a first process for forming an oxide film on the substrate and a second process for forming an oxynitride film by subjecting the oxide film formed by the first process to nitriding processing by activated species of nitrogen activated by plasma are continuously carried out by changing the high frequency impedance of the substrate-supporting body by the changing device.

According to a fifth aspect of the present invention, there is provided a semiconductor device producing method using a plasma processing apparatus including a processing chamber, a substrate-supporting body which supports a substrate in the processing chamber, and a cylindrical electrode and a magnetic lines of force-forming member disposed around the processing chamber, comprising:

for forming a nitride film on the substrate, and thereafter, by changing a high frequency impedance of the substrate-supporting body, continuously forming an oxynitride film by oxidizing the nitride film by activated species of oxygen which are activated by plasma.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 2:
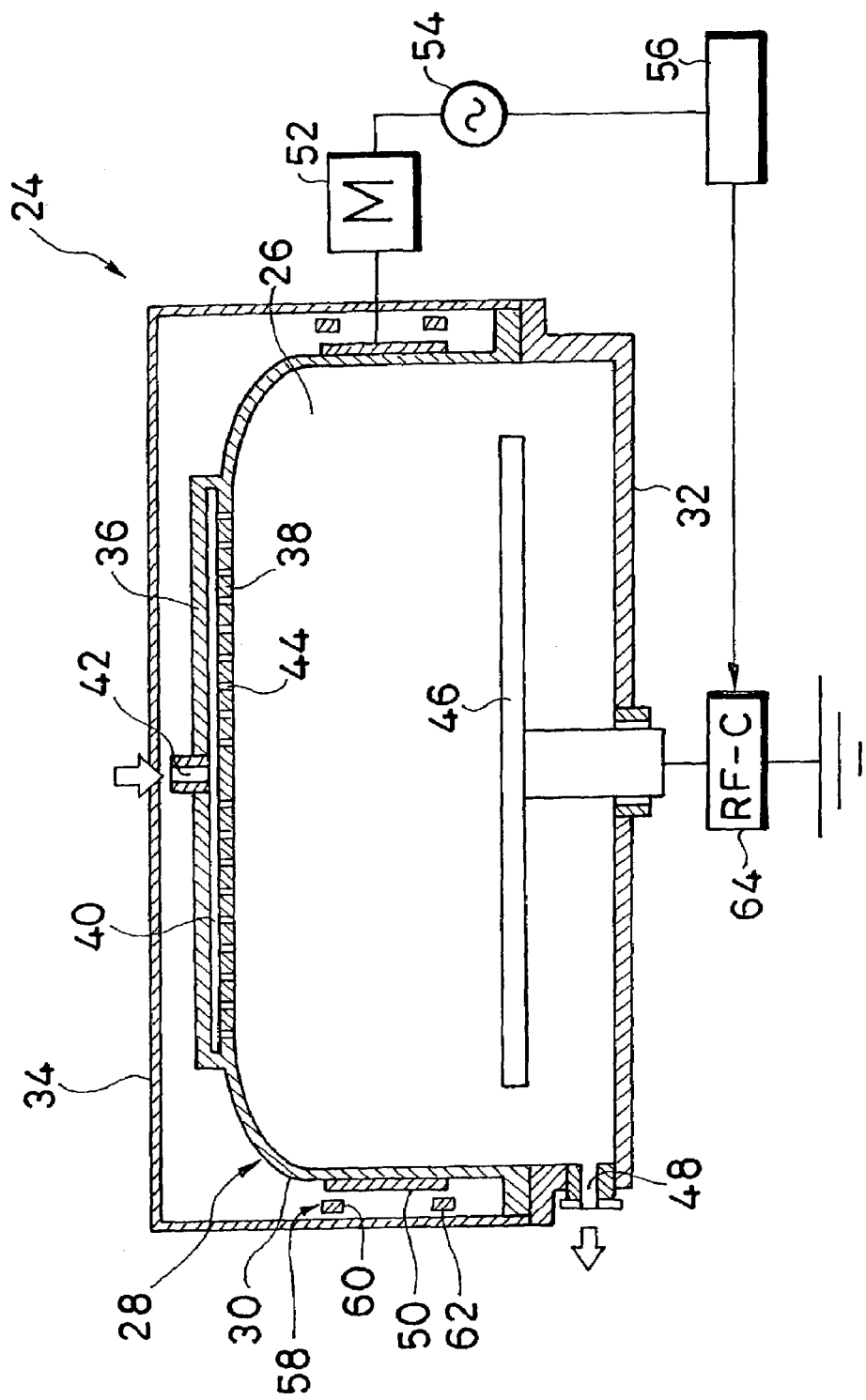
FIG. 2 is a schematic longitudinal sectional view for explaining a modified magnetron typed plasma processing apparatus (MMT apparatus) used in a producing method of a semiconductor device according to an embodiment of the present invention.

Next, an embodiment of the present invention will be explained with reference to the drawings FIG. 2 shows a modified magnetron typed plasma processing apparatus (MMT apparatus) 24 used in this embodiment. The MMT apparatus 24 includes a vacuum container 28 constituting a processing chamber 26. The vacuum container 28 comprises an upper container 30 and a lower container 32 which are bonded to each other from above and below respectively. The upper container 30 is made of ceramic such as alumina and quartz. The lower container 32 is made of metal. The upper container 30 is covered with a cover 34. The upper container 30 is cylindrical in shape and has a domical ceiling. This ceiling is formed with an upper lid 36 and a shower plate 38. A dispersion chamber 40 is formed between the upper lid 36 and the shower plate 38. The upper lid 36 is formed with an introducing port 42 for introducing processing gas. The shower plate 38 is formed with a large number of nozzles 44. Two kinds, for example, of processing gases introduced from the introducing port 42 are mixed and dispersed in the dispersion chamber 40, and supplied from the nozzles 44 of the shower plate 38 to the processing chamber 26.

A susceptor 46 which is a substrate-supporting body for supporting a substrate is disposed in the processing chamber 26. The susceptor 46 is provided with a heater for heating the substrate. An exhaust port 48 is formed in the lower container 32 so that processing gas in the processing chamber 26 is discharged from the exhaust port 48.

A cylindrical electrode 50 is disposed around the processing chamber 26 such that the cylindrical electrode 50 is disposed at a distance of 1 mm to 3 mm from an outer periphery of the upper container 30. The cylindrical electrode 50 is connected to a high frequency power supply 54 through a matching device 52. The high frequency power supply 54 generates high frequency electric power having a frequency of 13.56 MHz for example, and the magnitude of electric power is adjusted in accordance with a control signal from a control unit 56. The magnetic lines of force-forming means 58 comprises two ring-like, for example, permanent magnets 60 and 62, and is disposed around the processing chamber 26. These two permanent magnets 60 and 62 are polarized in opposite directions from each other in a diametrical direction of the processing chamber 26. Magnetic lines of force extending from the one permanent magnet 60 toward a center of the processing chamber 26 and returning to the other permanent magnet 62 are formed in the processing chamber 26.

A high frequency circuit (impedance variable circuit) 64 is connected to the susceptor 46. The high frequency circuit 64 can adjust a susceptor impedance in accordance with a control signal from the control unit 56.

The high frequency circuit 64 comprises a coil and a variable capacitor, and by controlling the number of patterns of the coil or a capacity value of the capacitor, an electric potential of a substrate W can be controlled through the susceptor 46.

Figure 3:
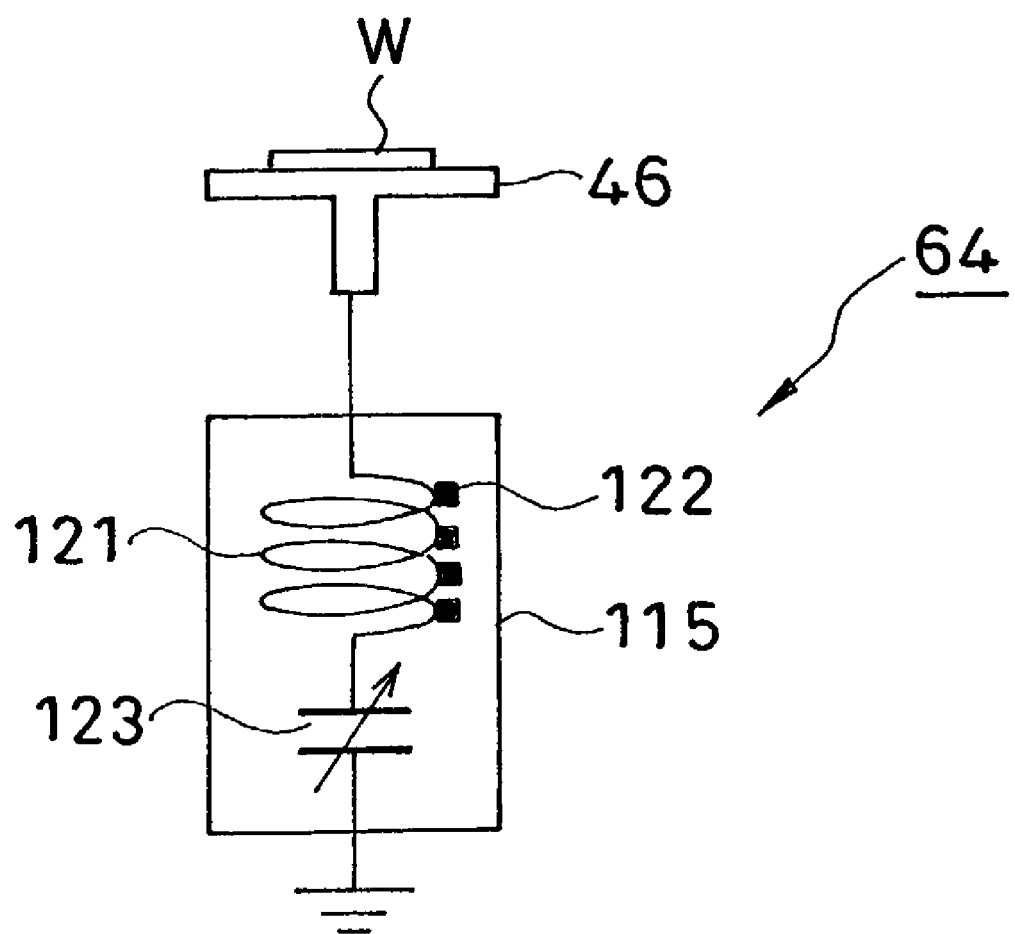
FIG. 3 is a circuit diagram for explaining a high frequency circuit of a modified magnetron typed plasma processing apparatus (MMT apparatus) used in a producing method of a semiconductor device according to an embodiment of the present invention.

FIG. 3 shows an internal circuit of the high frequency circuit 64. The circuit includes no power supply, and comprises passive elements only. More specifically, the coil 121 and the capacitor 123 are connected to each other in series. The coil 121 is provided at its several locations with terminals 122. The terminals 122 are arbitrarily short-circuited to control the number of patterns of the coil so that a desired inductance value can be obtained. A variable capacitor capable of linearly varying the electrostatic capacity of its own is used as the capacitor 123. An electric potential of the substrate W can be controlled by adjusting at least one of the coil 121 and the capacitor 123 and by adjusting the impedance of the high frequency circuit 64 to a desired value. Although it is possible to change the impedance of the high frequency circuit 64 by adjusting at least one of the variable coil and the variable capacitor in this manner, it is of course possible to switch between two or more circuits having different impedances even when a fixed coil and a fixed capacitor are used.

In the MMT apparatus 24 according to the embodiment of the present invention, magnetron discharge is generated due to an influence of magnetic fields of the permanent magnets 60 and 62, electric charge is trapped in a space above the substrate W and high concentration plasma is produced. By the produced high concentration plasma, a surface of the substrate W on the susceptor 46 is subjected to plasma oxidation processing or plasma nitriding processing. The surface processing is started and finished by supplying high frequency electric power and stopping the supply.

When a surface or a lower film surface of the substrate W is subjected to the oxidation processing or the nitriding processing, an impedance of the high frequency circuit 64 interposed between the susceptor 46 and the earth is previously controlled to a desired value. If the impedance of the high frequency circuit 64 is adjusted to the desired value, the electric potential of the substrate W is controlled accordingly, and it is possible to form an oxide film or a nitride film having a desired film thickness and uniformity of film thickness over the entire surface of the film.

According to a parallel flat plate electrode type plasma apparatus which controls an output value of high frequency electric power and controls supply of bias electric power, film thickness can not be controlled by controlling an impedance by means of the above-described MMT apparatus. In principle, it is possible to form an oxide film or a nitride film of 3 nm or more even by the parallel flat plate electrode type plasma apparatus if voltage of the susceptor is increased. However, since the parallel flat plate electrode type plasma apparatus can not independently control the voltage for discharge and the voltage of the susceptor, if the voltage of the susceptor is increased, strong electric field is applied to the substrate. Therefore, the film quality and film thickness uniformity are deteriorated by the plasma damage. In the MMT apparatus of the present embodiment, electric field is applied by the discharge electrode and the electric charge is trapped by the magnetic lines of force, thereby increasing the plasma concentration as compared with the parallel flat plate electrode type plasma apparatus. Further, in order to enhance the plasma processing efficiency, the susceptor electric potential which can be controlled independently from the plasma production is controlled instead of the voltage of the discharge electrode which produces plasma. Therefore, the substrate is not damaged by plasma, and the quality of a formed film can be maintained excellently.

Next, the operation of the MMT system 24 will be explained. First, the substrate is placed on the susceptor 46, gas in the vacuum container 28 is discharged from the exhaust port 48 to bring an interior of the vacuum container 28 into a vacuum state. Next, the susceptor 46 is heated, and a temperature of the semiconductor substrate is heated to 400° C., for example. Then, processing gas is introduced from the introducing port 42. The processing gas introduced from the introducing port 42 is diffused in the diffusion chamber 40, and supplied from the nozzle 44 of the shower plate 38 to the processing chamber 26. At the same time, high frequency electric power is supplied from the high frequency power supply 54 to the cylindrical electrode 50. Magnetic lines of force is formed by the magnetic lines of force-forming means 58 in the processing chamber 26, and high frequency electric field is formed by the cylindrical electrode 50. Therefore, plasma is generated, and the semiconductor substrate on the susceptor 46 is processed. After predetermined time is elapsed, the supply of high frequency electric power from the high frequency power supply 54 is stopped, gas in the vacuum container 28 is discharged from the exhaust port 48, the substrate on the susceptor 46 is taken out from the processing chamber 26, and the processing procedure is completed.

In the embodiment of the present invention, a first process in which an oxide film is formed on a substrate by changing or adjusting a high frequency impedance of the substrate-supporting body (susceptor) 46, and a second process in which the oxide film formed by the first process is subjected to the nitriding processing by activated species of nitrogen which are activated by plasma to form an oxynitride film are continuously carried out.

It is preferable that the first process is carried out by introducing a large amount of krypton and a small amount of oxygen into the processing chamber. The first process can be carried out by introducing oxygen only into the processing chamber, though. In the first process, it is necessary to form a good-quality oxide film. For this purpose, a large amount of Kr gas whose first excitation has the same energy band as that of the oxygen radical is introduced into the processing chamber together with a small amount of oxygen to generate plasma, and the substrate made of silicon for example is oxidized by the oxygen radical. The high frequency impedance of the substrate-supporting body is adjusted such that a phase of an electric potential of plasma generated by the cylindrical electrode and magnetic lines of force-forming means and a phase of an electric potential of the substrate-supporting body are matched to each other. With this, it is possible to prevent, to the utmost, ion from entering a substrate on the substrate-supporting body, and the substrate is oxidized by oxygen radicals existing in plasma in large amount.

In the second process, when nitriding is carried out, although excitation energy of nitrogen is low, N2 must be dissociated completely in order to bring the nitrogen atom into the oxide film so that the film becomes an SiON film. Activation energy for dissociation is extremely high. Therefore, contrary to the first process, the high frequency impedance of the substrate-supporting body is adjusted such that the phases of the electric potential of the plasma and the substrate-supporting body are inverted so that the plasma and the substrate-supporting body resonate, and ion incident to the oxide film is maximized.

In the second process, it is preferable that He gas is added to the processing gas. Dissociation energy of He is extremely high, and if He is added to nitrogen as mixture gas, it is possible to bring a state of the mixture gas into a higher state than the excitation of the $N_2$, and to assist the production of monatomic nitrogen.

Japanese Patent Application Laid-open No. 2001-160555 discloses a producing method of a semiconductor device for continuously forming an oxide film and a nitride film on a silicon substrate using a plasma processing apparatus. This publication does not disclose a fact that an oxynitride film is formed and a formation method of the oxynitride film. In this conventional example, micro wave of 2.45 GHz for example is used as a plasma source, an electron temperature Teb of plasma excited by this micro wave becomes high (Teb>5 ev), and if the oxynitride film is to be formed as in the present embodiment of the invention, it is difficult to control, to a low value, nitrogen concentration of an interface between the oxynitride film and the substrate. Whereas, in the embodiment of the invention, since the above-described deformed magnetron typed plasma processing apparatus is used, it is possible to lower the electron temperature Tea of plasma (e.g., Tea<1 eV), and it is possible to lower the nitrogen concentration of the interface between the oxynitride film and the surface to a low value as low as 1.5% or less. Here, the concentration of nitrogen is a value obtained by dividing the number of nitrogen atoms per unit volume in the oxynitride film by the total electron number (which is the total number of silicon atoms, oxygen atoms and nitrogen atoms, and is about 6.6×10^22) per unit volume of the oxynitride film. In the above conventional example, $NH_3$ (or mixture gas of $N_2$ and $H_2$) is used as the processing gas for nitriding the substrate surface, H atom exists in the oxynitride film, which adversely affects the device characteristics such as leak current. In the present invention, whereas, since nitrogen gas is used as the processing gas, the device characteristics of the semiconductor device are excellent.

Figure 1A:
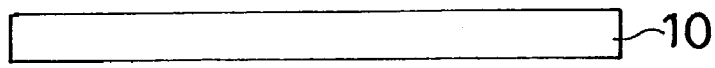
FIGS. 1A to 1E are schematic longitudinal sectional views for explaining a producing method of a semiconductor device according to an embodiment of the present invention.
Figure 1B:
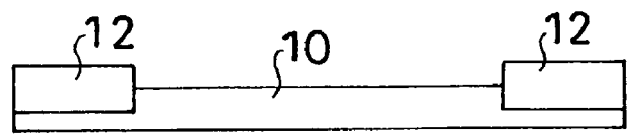
Figure 1C:
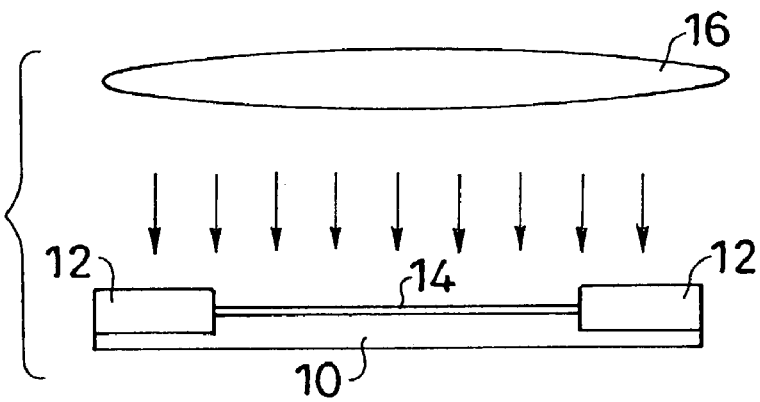

FIGS. 1A–1E show a producing process of a semiconductor device according to the embodiment of the invention. First, on a semiconductor substrate 10 such as a silicon substrate shown in FIG. 1A, device separation regions 12 shown in FIG. 1B are formed by a known method such as an LOCOS (Local Oxidation of Silicon) process or an STI (Shallow Trench Isolation) process.

Next, well ion implantation, channel stop ion implantation, and threshold adjusting ion implantation are carried out by a known method. Then, an oxide film 14 having the quality equal to or higher than that of the thermal oxide film is formed on the semiconductor substrate 10 using the MMT apparatus. A large amount of krypton KR and oxygen are introduced into the processing chamber of the MMT apparatus to produce $Kr/O_2$ plasma, thereby forming the oxide film 14. The reason why Kr is used is that energy band for activating Kr is low, and Kr well matches with radical excitation energy of $O_2$. It is preferable that a film thickness of the oxide film 14 is set to 25 Å or less.

Figure 1D:
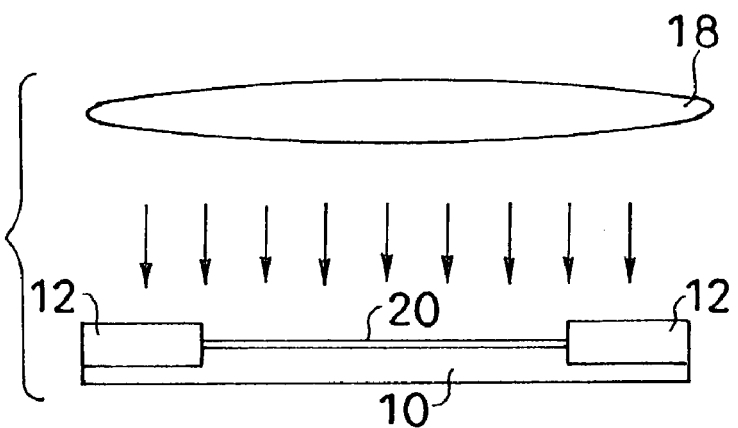

Next, in the MMT apparatus, $Kr/O_2$ gas is exhausted, nitrogen gas is introduced to replace the gas to form nitrogen atmosphere. As shown in FIG. 1D, nitrogen plasma 18 is produced, the semiconductor substrate 10 which is disposed in the processing chamber and whose surface is oxidized is subjected to the nitriding processing, thereby forming an oxynitride film 20. A film thickness of the oxynitride film 20 is 25 Å or less. It is preferable to adjust such that a peak of nitrogen concentration of the oxynitride film 20 becomes 5 to 15% and nitrogen concentration of an interface between the oxynitride film 20 and the semiconductor substrate 10 becomes 1.5% or lower. As the peak of the nitrogen concentration of the oxynitride film 20 is higher, the leak current preventing effect as an insulative film is more excellent. If the peak of the nitrogen concentration of the oxynitride film 20 exceeds 15%, however, the nitrogen concentration of the interface between the oxynitride film 20 and the semiconductor substrate 10 exceeds 1.5%. If the nitrogen concentration of the interface between the oxynitride film 20 and the semiconductor substrate 10 exceeds 1.5%, mobility of the semiconductor device (moving degree, i.e., current driving ability of the semiconductor device) is deteriorated. Therefore, it is preferable that the nitrogen concentration of the interface is 1.5% or lower.

If He gas is added, in addition to the nitrogen gas, it is possible to further reduce the nitrogen concentration of the interface between the oxynitride film 20 and the semiconductor substrate 10 as described above.

Figure 1E:
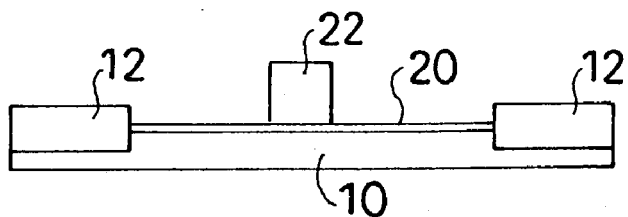

As shown in FIG. 1E, a gate electrode 22 made of poly-silicon or the like is formed by a known method such as CVD. Boron atom (B) is included in the gate electrode 22 as impurities. Then, word line or capacitor are formed, and a DRAM for example is formed. As described above, boron atom (B) is dispersed and tries to reach the semiconductor substrate 10 by various thermal processing after the gate electrode 22 is formed, but it is possible to prevent the boron atom from reaching the substrate 10 by the existence of the oxynitride film 20.

Next, examples in which the above-described oxynitride film is formed using the MMT apparatus will be explained.

EXAMPLE 1

As the first process, an oxide film of 2.0 nm was formed on a silicon substrate using the MMT apparatus. The plasma oxidizing conditions are as follows. Here, if the high frequency circuit 64 connected to the susceptor 46 is adjusted and the susceptor electric potential is amplified with about 0V to −20V, since the plasma electric potential is about +20V, a potential difference between the susceptor and the plasma producing region becomes about 20V to 50V. In this case, a phase difference between the potential of the susceptor 46 and the potential of the plasma producing region is adjusted to about 0°.

RF power: 150W
Kr flow rate: 250 sccm
$O_2$ flow rate: 10 sccm
pressure: 20 Pa
substrate temperature: 400° C.
oxidation time: 20 sec Next, as the second process, gas was replaced in the same MMT apparatus, and plasma nitriding processing was continuously carried out, thereby forming an oxynitride film of 2.0 nm. The plasma nitriding conditions are as follows. Here, if the high frequency circuit 64 connected to the susceptor 46 is adjusted and the susceptor electric potential is amplified with about 0V to −300V, since the plasma electric potential is about +20V, a potential difference between the susceptor and the plasma producing region becomes about 20V to 330V. In this case, a phase difference between the potential of the susceptor 46 and the potential of the plasma producing region is adjusted to about 180°.

Figure 4:
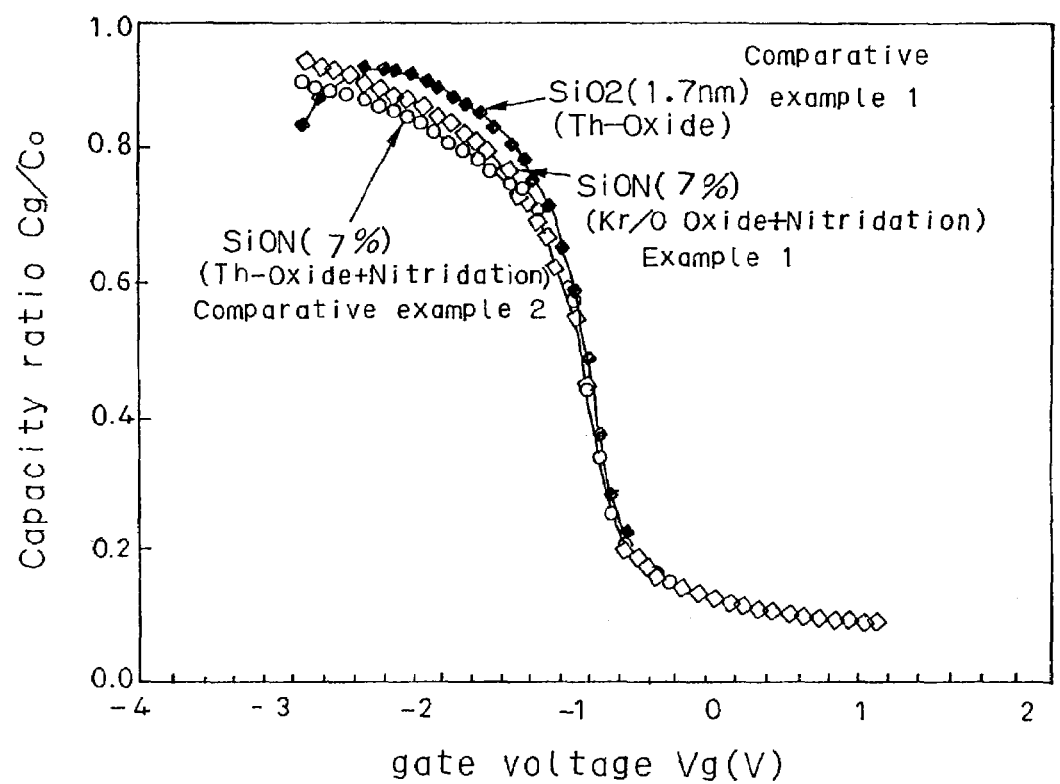
FIG. 4 is a C-V characteristic diagram showing a result of an Example 1 of the present invention.

RF power: 500W
$N_2$ flow rate: 500 sccm
pressure: 30 Pa
substrate temperature: 400° C.
oxidation time: 25 sec FIG. 4 shows C-V characteristics in comparison with comparative examples. In the comparative example 1, a silicon oxide film of 1.7 nm was formed by thermal oxidation processing, and the nitriding processing was not carried out. In the comparative example 2, the same oxide film as that of the example 1 was formed by thermal oxidation processing, the oxide film was subjected to nitriding processing such that the peak of the nitrogen concentration of the oxynitride film became 7% to form the oxynitride film. In the example 1, there is no drop down in capacity ratio at the gate voltage of −2V as compared with the comparative example 1 and thus, gate pressure resistance is enhanced. The rising edge when the gate voltage is −1V is substantially the same and flat band voltage is not varied. In the example 1, since the capacity ratio is smaller than that of the comparative example 1, the effective film thickness (effective insulative film thickness Teff or equivalent oxide film thickness Eot) becomes small. Therefore, it can be found that the insulative film formed by the example 1 has more excellent device characteristics as compared with the comparative example 1.

EXAMPLE 2

An oxide film was formed under the same plasma oxidizing conditions and then, gas was replaced, and plasma nitriding processing was continuously carried out, thereby forming an oxynitride film of 2.0 nm. He gas was added to nitrogen gas, and the following plasma nitriding conditions were employed. Like the example 1, The high frequency circuit 64 is adjusted in the same manner as in the example 1.

Figure 5:
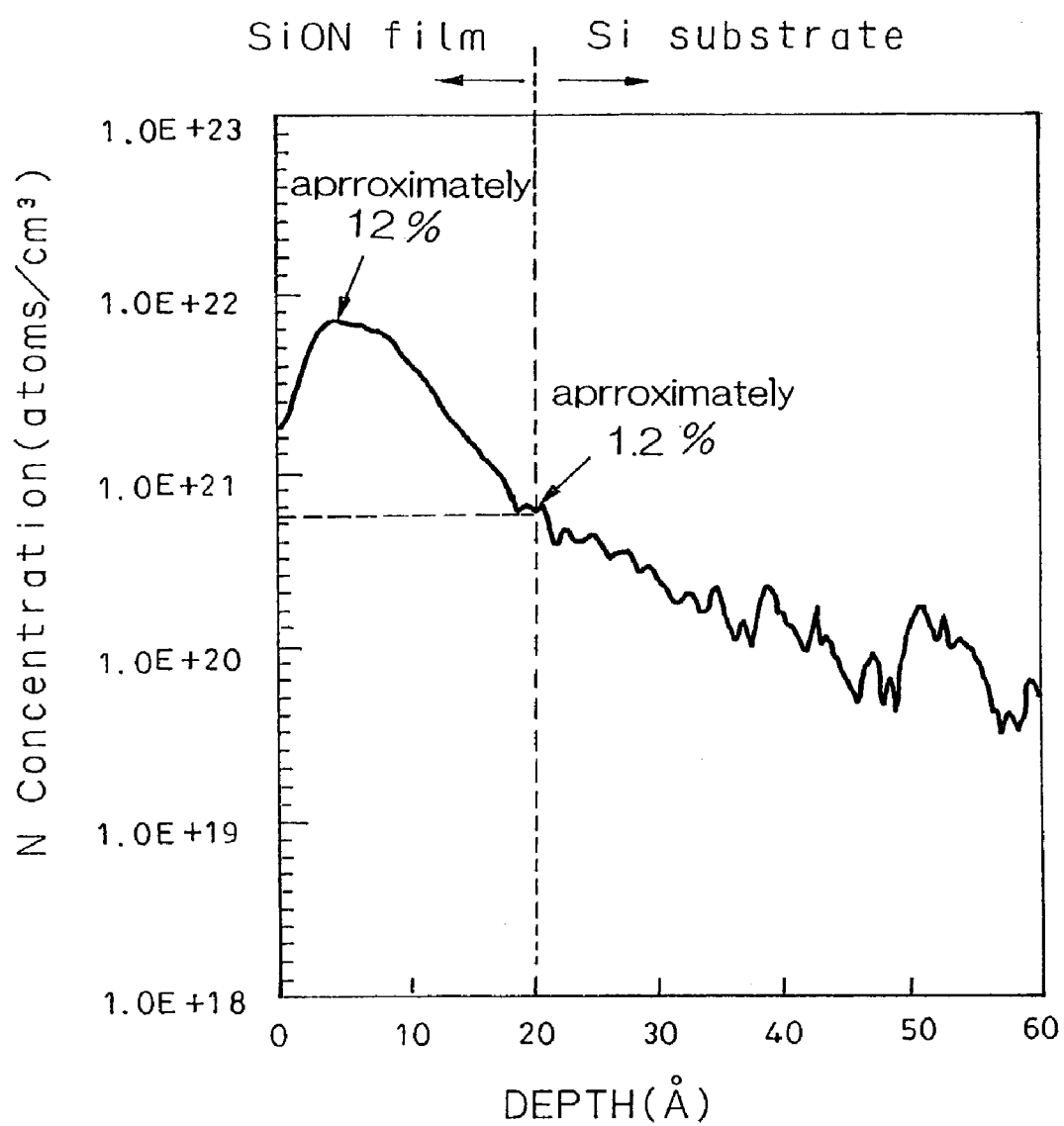
FIG. 5 is a Secondary Ion Mass Spectroscopy (SIMS) analysis chart showing a result of an Example 2 of the present invention.

RF power: 500W
$N_2$ flow rate: 250 sccm
He flow rate: 250 sccm
pressure: 30 Pa
substrate temperature: 400° C.
oxidation time: 25 sec As a result, a silicon substrate having an oxynitride film shown in FIG. 5 was obtained. FIG. 5 shows an SIMS (Secondary Ion Mass Spectroscopy) analysis chart. CS+ was used as primary acceleration ion species of the spectrometry, the primary acceleration voltage was set to 0.75 KV, a sputter rate was set to 0.01 nm/sec, and the amount of +ion was measured. The peak of the nitrogen concentration of the oxynitride film was 12%, and the nitrogen concentration of the interface between the oxynitride film and the silicon substrate was 1.2%. If He is added, since the mass of He is small, it is possible to avoid into high frequency electric field of 13.56 MHz, sheath voltage formed on a surface of the substrate becomes small, ion energy of nitrogen entering the substrate surface also becomes small. Therefore, in order to provide the same nitrogen concentration, it is possible to further reduce the nitrogen concentration of the interface between the oxynitride film and the substrate.

It is possible to freely control the thickness of the oxide film in a range of 5 to 100 Å by changing the $Kr/O_2$ plasma producing conditions and the like. It is also possible to freely control the nitrogen concentration of the surface of the oxynitride film in a range of 0 to 120% by changing the nitrogen plasma producing conditions and the like. A pressure in the first process can be set to 150 Pa or lower, and a pressure in the second process can be set to 10 to 100 Pa.

The number of plasma ions is greater than the number of electrons in the plasma generating region, and adjustment is made such that space electric potential is 30 to 50V, and susceptor electric potential is −several hundred volts. Oxygen or nitrogen plus ion is attracted by minus electric potential and enters into the substrate. If a difference between the plasma space electric potential and the susceptor electric potential is made large, a thick film can be formed. When an oxide film is to be plasma-nitrided, there is a tendency that the difference between the plasma space electric potential and the susceptor electric potential must be increased.

Thereupon, in the above example, the difference between the electric potential of the plasma producing region and the susceptor electric potential is maximum in the case of plasma oxidation, and difference between the electric potential of the plasma producing region and the susceptor electric potential is minimum in the case of plasma nitriding.

In the cases of plasma oxidation and plasma nitriding, the susceptor electric potential can be controlled between the maximum value and the minimum value in accordance with the target film thickness.

In the above example 1, an oxide film is formed by plasma oxidation and then, high frequency impedance of the substrate-supporting body is changed or switched, thereby subjecting the oxide film to nitriding processing by activated species of nitrogen activated by plasma to form an oxynitride film. Alternatively, by changing or switching the high frequency impedance of the substrate-supporting body, it is also possible to continuously carry out the first process for forming a nitride film by plasma nitriding and the subsequent second process for subjecting the nitride film formed by the first process to oxidation processing by activated species of oxygen which is activated by plasma.

In this case, in both the plasma oxidation and plasma nitriding, susceptor potential is controlled between a maximum value and a minimum value according to a target film thickness. In this case also, when the nitride film is subjected to plasma oxidation, there is a tendency that the susceptor potential must be more reduced as compared with a case in which the substrate is directly subjected to the plasma oxidation as in the example 1.

As described above, according to the embodiment of the invention, since the nitrogen atom is introduced into the oxide film, it is possible to restrain leak current when the oxynitride film is made as an insulative film. The first process for oxidizing the substrate and the second process for nitriding the oxide film are continuously carried out in the one plasma processing apparatus by switching the high frequency impedance of the substrate-supporting body. Therefore, it is possible to prevent organic contaminant from adhering to a surface of a substrate between the first process and the second process, and it is possible to enhance the throughput in semiconductor production and cost performance.

The entire disclosures of Japanese Patent Application No. 2002-85224 filed on Mar. 26, 2002, Japanese Patent Application No. 2002-145759 filed on May 21, 2002 and Japanese Patent Application No. 2002-101103 filed on Apr. 3, 2002 including specifications, claims, drawings and abstracts are incorporated herein by reference in their entireties.

Although various exemplary embodiments have been shown and described, the invention is not limited to the embodiments shown. Therefore, the scope of the invention is intended to be limited solely by the scope of the claims that follow.

What is claimed is:

1. A semiconductor device producing method using a plasma processing apparatus including a processing chamber, a substrate-supporting body for supporting a substrate in said processing chamber, and a cylindrical electrode and a member for forming magnetic lines of force disposed around said processing chamber, comprising:
    forming an oxide film on said substrate while maintaining the high-frequency impedance of the substrate-supporting body at a first level;
    changing the high-frequency impedance of the substrate-supporting body to a second level different than the first level;
    thereafter maintaining the high-frequency impedance of the substrate-supporting body at the second level while changing the oxide film to an oxynitride film by continuously nitriding the oxide film by plasma-activated species of nitrogen.

2. The method of claim 1 wherein said first level favors oxidizing over nitriding and the second level favors nitriding over oxidizing.

3. The method of claim 1 including the additional steps of:
    adding oxygen to the processing chamber before said step of forming a first film;
    exhausting the oxygen from the processing chamber after forming the first film; and
    adding nitrogen to the processing chamber before nitriding the first film.

4. The method of claim 1 including the additional step of maintaining a first phase difference between the phase of the plasma and the phase of the substrate-supporting body during the step of forming an oxide film and maintaining a second phase difference different than the first phase difference between the phase of the plasma and the phase of the substrate-supporting body during the step of nitriding the oxide film.

5. The method of claim 4 wherein said first phase difference is zero degrees and said second phase difference is 180 degrees.

6. A semiconductor device producing method using a plasma processing apparatus including a processing chamber, a substrate-supporting body which supports a substrate in said processing chamber, and a cylindrical electrode and a magnetic lines of force-forming member disposed around said processing chamber, comprising:

forming an oxide film on said substrate; and
thereafter changing the high-frequency impedance of the substrate-supporting body to change the oxidizing process to a nitriding process and continuously forming an oxynitride film by nitriding said oxide film by activated species of nitrogen which are activated by plasma.

7. A semiconductor device producing method using a plasma processing apparatus including a processing chamber, a substrate-supporting body for supporting a substrate in said processing chamber, and a cylindrical electrode and a member for forming magnetic lines of force disposed around said processing chamber, comprising:
forming an oxide film on said substrate while maintaining the electric potential of the substrate-supporting body at a first level;
changing the electric potential of the substrate-supporting body to a second level different than the first level;
thereafter maintaining the electric potential of the substrate-supporting body at the second level while changing the oxide film to an oxynitride film by continuously nitriding the oxide film by plasma-activated species of nitrogen.

8. The method of claim 7 wherein said first level favors oxidizing over nitriding and the second level favors nitriding over oxidizing.

9. The method of claim 7 including the additional steps of:
adding oxygen to the processing chamber before said step of forming a first film;
exhausting the oxygen from the processing chamber after forming the first film; and
adding nitrogen to the processing chamber before nitriding the first film.

10. The method of claim 7 including the additional step of maintaining a first phase difference between the phase of the plasma and the phase of the substrate-supporting body during the step of forming an oxide film and maintaining a second phase difference different than the first phase difference between the phase of the plasma and the phase of the substrate-supporting body during the step of nitriding the oxide film.

11. The method of claim 10 wherein said first phase difference is zero degrees and said second phase difference is 180 degrees.

12. A semiconductor device producing method using a plasma processing apparatus including a processing chamber, a substrate-supporting body which supports a substrate in said processing chamber, and a cylindrical electrode and a magnetic lines of force-forming member disposed around said processing chamber, comprising:
forming an oxide film on said substrate; a
thereafter changing the electric potential of the substrate-supporting body to change the oxidizing process to a nitriding process and continuously forming an oxynitride film by nitriding said oxide film by activated species of nitrogen which are activated by plasma.

13. A semiconductor device producing method using a plasma processing apparatus including a processing chamber, a substrate-supporting body for supporting a substrate in said processing chamber, and a cylindrical electrode and a member for forming magnetic lines of force disposed around said processing chamber, comprising:
forming an oxide film on said substrate while maintaining a difference between an electric potential of the substrate-supporting body and a space electric potential of the plasma producing region at a first level;
changing the difference between the electric potential of the substrate-supporting body and the space electric potential of the plasma producing region to a second level different than the first level;
thereafter maintaining the difference between the electric potential of the substrate-supporting body and a space electric potential of the plasma producing region at the second level while changing the oxide film to an oxynitride film by continuously nitriding the oxide film by plasma-activated species of nitrogen.

14. The method of claim 13 wherein said first level favors oxidizing over nitriding and the second level favors nitriding over oxidizing.

15. The method of claim 13 including the additional steps of:
adding oxygen to the processing chamber before said step of forming a first film;
exhausting the oxygen from the processing chamber after forming the first film; and
adding nitrogen to the processing chamber before nitriding the first film.

16. The method of claim 13 including the additional step of maintaining a first phase difference between the phase of the plasma and the phase of the substrate-supporting body during the step of forming an oxide film and maintaining a second phase difference different than the first phase difference between the phase of the plasma and the phase of the substrate-supporting body during the step of nitriding the oxide film.

17. The method of claim 16 wherein said first phase difference is zero degrees and said second phase difference is 180 degrees.

18. A semiconductor device producing method using a plasma processing apparatus including a processing chamber, a substrate-supporting body which supports a substrate in said processing chamber, and a cylindrical electrode and a magnetic lines of force-forming member disposed around said processing chamber, comprising:
forming an oxide film on said substrate; and
thereafter changing a difference between an electric potential of the substrate-supporting body and a space electric potential of the plasma producing region to change the oxidizing process to a nitriding process and continuously forming an oxynitride film by nitriding said oxide film by activated species of nitrogen which are activated by plasma.

19. A semiconductor device producing apparatus comprising:
a plasma processing apparatus including a processing chamber;
a substrate-supporting body for supporting a substrate in said processing chamber;
a cylindrical electrode and a member for forming magnetic lines of force disposed around said processing chamber;
means for forming an oxide film on said substrate while maintaining the high-frequency impedance of the substrate-supporting body at a first level;
means for changing the high-frequency impedance of the substrate-supporting body to a second level different than the first level; and
means for maintaining the high-frequency impedance of the substrate-supporting body at the second level while changing the oxide film to an oxynitride film by continuously nitriding the oxide film by plasma-activated species of nitrogen.

20. A semiconductor device producing apparatus comprising:
- a plasma processing apparatus including a processing chamber;
- a substrate-supporting body for supporting a substrate in said processing chamber;
- a cylindrical electrode and a member for forming magnetic lines of force disposed around said processing chamber;
- means for forming an oxide film on said substrate while maintaining the electric potential of the substrate-supporting body at a first level;
- means for changing the electric potential of the substrate-supporting body to a second level different than the first level; and
- means for maintaining the electric potential of the substrate-supporting body at the second level while changing the oxide film to an oxynitride film by continuously nitriding the oxide film by plasma-activated species of nitrogen.

21. A semiconductor device producing apparatus comprising:
- a plasma processing apparatus including a processing chamber;
- a substrate-supporting body for supporting a substrate in said processing chamber;
- a cylindrical electrode and a member for forming magnetic lines of force disposed around said processing chamber;
- means for forming an oxide film on said substrate while maintaining the difference between an electric potential of the substrate-supporting body and a space electric potential of the plasma producing region at a first level;
- means for changing the difference between the electric potential of the substrate-supporting body and a space electric potential of the plasma producing region to a second level different than the first level; and
- means for maintaining the difference between the electric potential of the substrate-supporting body and the space electric potential of the plasma producing region at the second level while changing the oxide film to an oxynitride film by continuously nitriding the oxide film by plasma-activated species of nitrogen.

* * * * *